(12) United States Patent
Hung et al.

(10) Patent No.: US 9,240,403 B2
(45) Date of Patent: Jan. 19, 2016

(54) EMBEDDED RESISTOR

(71) Applicant: UNITED MICROELECTRONICS CORP., Hsin-Chu (TW)

(72) Inventors: Ching-Wen Hung, Tainan (TW); Chih-Sen Huang, Tainan (TW); Po-Chao Tsao, New Taipei (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/781,761

(22) Filed: Mar. 1, 2013

(65) Prior Publication Data

US 2014/0246730 A1    Sep. 4, 2014

(51) Int. Cl.
| H01L 27/06 | (2006.01) |
|---|---|
| H01L 27/02 | (2006.01) |
| H01L 27/07 | (2006.01) |
| H01L 29/73 | (2006.01) |
| H01L 49/02 | (2006.01) |

(52) U.S. Cl.
CPC ........ *H01L 27/0629* (2013.01); *H01L 27/0288* (2013.01); *H01L 27/0738* (2013.01); *H01L 28/20* (2013.01); *H01L 28/24* (2013.01); *H01L 29/7304* (2013.01)

(58) Field of Classification Search
CPC ............ H01L 27/0288; H01L 29/7304; H01L 27/0629; H01L 27/0738; H01L 28/20
USPC ......................................... 257/359, 363, 536
See application file for complete search history.

(56) References Cited

U.S. PATENT DOCUMENTS

| 6,069,398 | A  * | 5/2000  | Kadosh et al. ................. 257/538 |
|---|---|---|---|
| 6,872,655 | B2   | 3/2005  | Mahalingam |
| 2004/0245575 | A1 * | 12/2004 | Beach et al. ................... 257/359 |
| 2009/0065898 | A1 * | 3/2009  | Chinthakindi et al. ........ 257/536 |
| 2009/0140387 | A1 * | 6/2009  | Yang ............................... 257/536 |
| 2013/0234292 | A1 * | 9/2013  | Wei et al. ....................... 257/536 |

OTHER PUBLICATIONS

Wei et al., Title: Thin Film Resistor Structure , pending U.S. Appl. No. 13/413,669, filed Mar. 7, 2012.

* cited by examiner

*Primary Examiner* — Phat X Cao
(74) *Attorney, Agent, or Firm* — Winston Hsu; Scott Margo

(57) ABSTRACT

An embedded resistor including a first interdielectric layer, a cap layer, a resistive layer and a cap film is provided. The first interdielectric layer is located on a substrate. The cap layer is located on the first interdielectric layer, wherein the cap layer has a trench. The resistive layer conformally covers the trench, thereby having a U-shaped cross-sectional profile. The cap film is located in the trench and on the resistive layer, or, an embedded thin film resistor including a first interdielectric layer, a cap layer and a bulk resistive layer is provided. The first interdielectric layer is located on a substrate. The cap layer is located on the first interdielectric layer, wherein the cap layer has a trench. The bulk resistive layer is located in the trench.

17 Claims, 6 Drawing Sheets

EMBEDDED RESISTOR

BACKGROUND OF THE INVENTION

1. Field of the Invention

The present invention relates generally to a resistor, and more specifically to an embedded resistor.

2. Description of the Prior Art

In a semiconductor process, semiconductor materials, such as polysilicon, are often positioned to function as resistors capable of providing high resistance. These resistors can be used in place of load transistors. When load transistors of a static random access memory (SRAM) are replaced by semiconductor resistors, the number of transistors in the SRAM can be reduced thereby saving costs and enhancing the integration of the SRAM.

Conventionally used semiconductor resistors can be divided into polysilicon resistors and diffusion resistors. A polysilicon resistor is formed, for example, by forming a polysilicon film into which dopants are doped through an insulating film on a semiconductor substrate. The resistance of the polysilicon resistor can be controlled by the dopant concentration of the polysilicon layer. A diffusion resistor is formed, for example, by doping dopants into a semiconductor substrate to form a diffusion layer, and then by using a thermal diffusion method to activate the dopants in the diffusion layer and adjust the resistance thereof. Normally, whether it is a polysilicon resistor or a diffusion resistor, the resistor has a sandwich-like structure that sandwiches a high resistance region between two low resistance ends. The low resistance ends are provided for forming interconnection contact plugs to connect the resistor with other wirings. The high resistance region is used to provide a high resistance to satisfy circuit designs or device demands.

With the development of the various and miniaturized electronic products, circuit designs applying load resistors become more and more complicated, and requirements in volume, position and high resistance of the load resistors therefore become more and more critical as well.

SUMMARY OF THE INVENTION

The present invention provides an embedded resistor, which forms trenches in materials and then fills resistor materials therein to form an embedded resistor having a U-shaped cross-sectional profile or a bulk embedded resistor.

The present invention provides an embedded resistor including a first interdielectric layer, a cap layer, a resistive layer and a cap film. The first interdielectric layer is located on a substrate. The cap layer is located on the first interdielectric layer, wherein the cap layer has a trench. The resistive layer having a U-shaped cross-sectional profile covers the trench. The cap film is located in the trench and on the resistive layer.

The present invention provides an embedded resistor including a first interdielectric layer, a cap layer and a bulk resistive layer. The first interdielectric layer is located on a substrate. The cap layer is located on the first interdielectric layer, wherein the cap layer has a trench. The bulk resistive layer is located in the trench.

According to the above, the present invention provides an embedded resistor, that forms trenches in materials such as a cap layer and then fills resistor materials therein to form an embedded resistor having a U-shaped cross-sectional profile or a bulk embedded resistor, thereby forming an embedded resistor. In this way, many problems can be solved, including: trenches formed in different areas such a transistor area and a resistor area for forming contact plugs having large depth differences, causing insufficient etching or over-etching, metals for forming contact plugs in these trenches may over-fill or fill insufficiently the trenches due to large difference in heights of the contact plugs, some of the contact plugs having lower heights may be entirely removed while an interdielectric being polished after the contact plugs are formed. Moreover, thanks to the present invention providing an embedded resistor, the resistive layer being etched while being patterned in the prior art that used to cause the bottom surface of the resistive layer to be undercut, can be avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
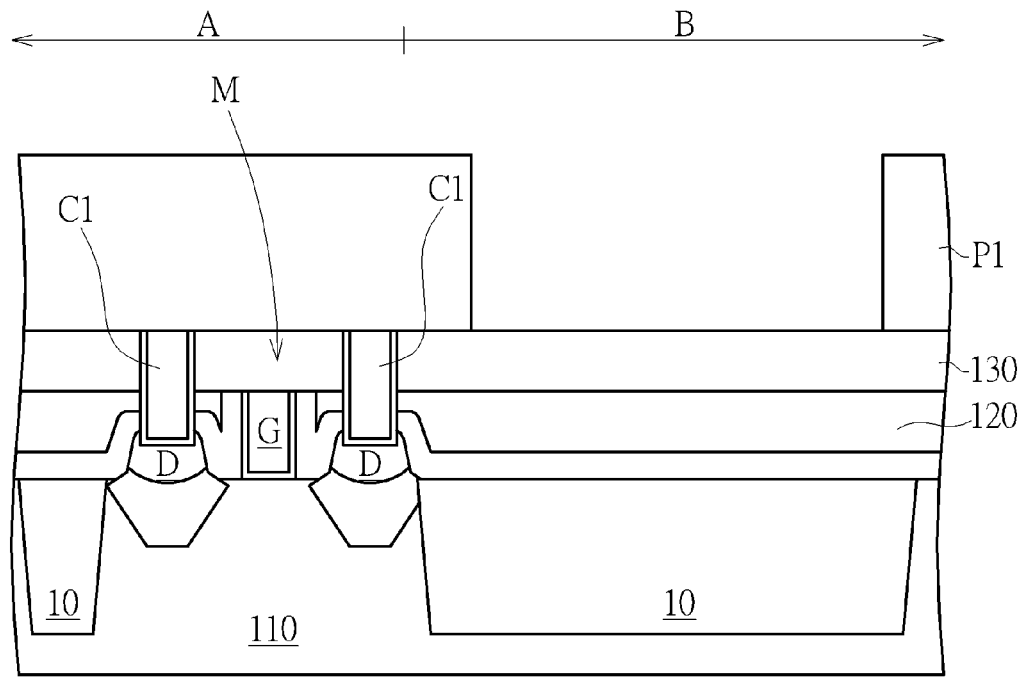
FIGS. 1-4 schematically depict cross-sectional views of an embedded resistor process according to a first embodiment of the present invention.

FIGS. 1-4 schematically depict cross-sectional views of an embedded resistor process according to a first embodiment of the present invention. As shown in FIG. 1, a substrate 110 including a first area A and a second area B is provided, wherein the first area A is a transistor area, while the second area B is a resistor area in this embodiment. A first interdielectric layer 120 is formed on the substrate 110 of the first area A and the second area B. The first interdielectric layer 120 may be an oxide layer, but it is not limited thereto. A MOS transistor M is disposed in the first interdielectric layer 120 in the first area A. A plurality of isolation structures 10 is located in the first area A and the second area B beside the MOS transistor M respectively. In this embodiment, the second area B will have a resistor formed above the first interdielectric layer 120, so that the isolation structure 10 become a bulk isolation structure in the substrate 10 of most parts of the second area B, so as to prevent circuit leakages from penetrating the first interdielectric layer 120 to the substrate 110 during later formations of resistors or contact plugs electrically connecting the resistors, but it is not limited thereto. In another embodiment, the isolation structures 10 in the substrate 110 of the second area B may be composed of a plurality of isolation structures; or, there is no isolation structure formed in the substrate 110 of the second area B. Furthermore, the isolation structures 10 in the substrate 110 of the first area A are used for electrically isolating semiconductor components such as other transistors from the MOS transistor M.

A cap layer 130 is formed on the first interdielectric layer 120. The cap layer 130 may be a silicon nitride layer or a carbon-doped silicon nitride layer, but it is not limited thereto. A gate G of the MOS transistor M (with the gate G being specifically a metal gate) can be isolated by the cap layer 130 and therefore can be protected from being damaged in later processes or from electrically connecting later formed metal wires above, which would lead to short circuits or circuit leakages. Thereafter, a lithography process is performed to pattern the cap layer 130 and the first interdielectric layer 120 so that a plurality of trenches (not shown) is formed therein and a source/drain region D of the MOS transistor M is exposed. Then, metal (not shown) is filled into the trenches and is planarized to form a plurality of slot contacts C1 or a plurality of columnar contact plugs (not shown) in the first interdielectric layer 120 and the cap layer 130, that are electrically connected to the MOS transistor M. The MOS transistor M may also include epitaxial structures K in the substrate 110 beside the gate G with parts of the epitaxial structures K may overlapping the source/drain region D, and metal silicide (not shown) between the source/drain region D and the slot contacts C1, wherein the metal silicide may be formed before/after the slot contacts C1 are formed. Slot contacts C1 may be composed of metals such as tungsten or copper, but it is not limited thereto. A patterned photoresist P1 is formed to cover the first area A but exposes the area for forming resistors in the second area B. The method for forming the patterned photoresist P1 may include entirely covering and patterning a photoresist (not shown).

Figure 2:
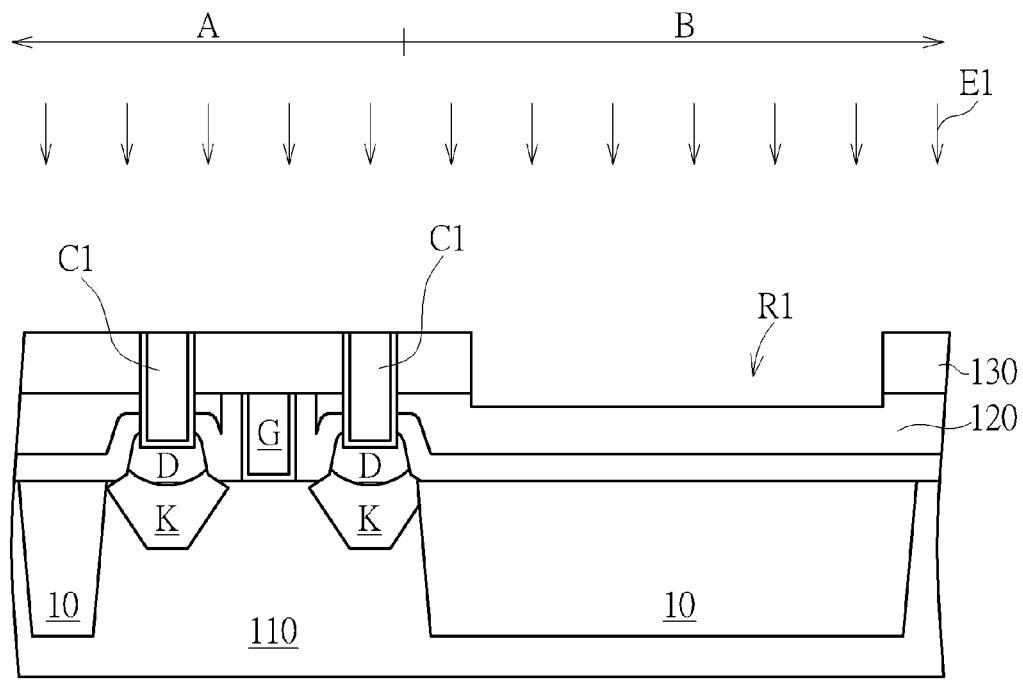

An etching process E1 is performed to etch the exposed part of the cap layer 130 by the patterned photoresist P1, so that a trench R1 is formed in the cap layer 130. In this embodiment, the cap layer 130 and the first interdielectric layer 120 have different materials, so that the first interdielectric layer 120 can be an etching stop layer while the etching process E1 is performed, thereby enabling the etching to stop on the first interdielectric layer 120. In another embodiment, parts of the first interdielectric layer 120 may be etched during the etching process E1, so that the trench R1 is located in the cap layer 130 and in parts of the first interdielectric layer 120. As shown in FIG. 2, the patterned photoresist P1 and the residues generated by the etching process are removed after the etching process E1 is performed.

Figure 3:
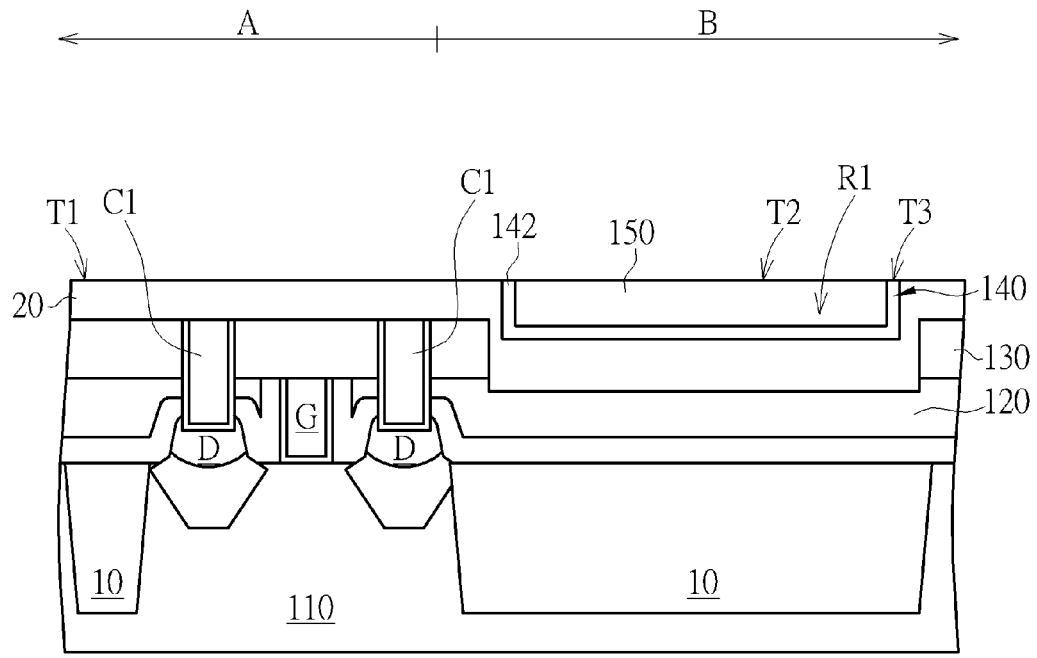

As shown in FIG. 3, a buffer layer 20 is selectively and conformally formed to cover the cap layer 130 and the trench R1. The buffer layer 20 may be an oxide layer, but it is not limited thereto. The buffer layer 20 can isolate the slot contacts C1 and protect it from being damaged by later processes, such as processes for forming metal layers thereon. A resistive layer (not shown) and a cap film (not shown) are sequentially formed to entirely cover the cap layer 130 (or the buffer layer 20), and then a planarization process, such as a chemical mechanical polishing process (CMP) process is performed to remove the resistive layer (not shown) and the cap film (not shown) rightly on the cap layer 130 by using the buffer layer 20 (or the cap layer 130) as a stop layer, so a resistive layer 140 covering the trench R1 and a cap film 150 on the resistive layer 140 and filling the trench R1 are formed, thereby giving the resistive layer 140 a U-shaped cross-sectional profile. The resistive layer 140 may be a titanium nitride layer or a tantalum nitride layer, and the cap film 150 may be a dielectric material such as a silicon nitride layer, but it is not limited thereto.

This way, the buffer layer 20 is disposed on the cap layer 130 but exposes the resistive layer 140 and the cap film 150. In this embodiment, the buffer layer 20 extends into and covers the trench R1 but is located below the resistive layer 140. A top surface T1 of the buffer layer 20 on the cap layer 130 is leveled with a top surface T2 of the cap film 150; the U-shaped resistive layer 140 has at least a vertical part 142 parallel to the sidewall of the trench R1, and the top surface T2 of the cap film 150 is leveled with the top end T3 of the vertical part 142.

Figure 5:
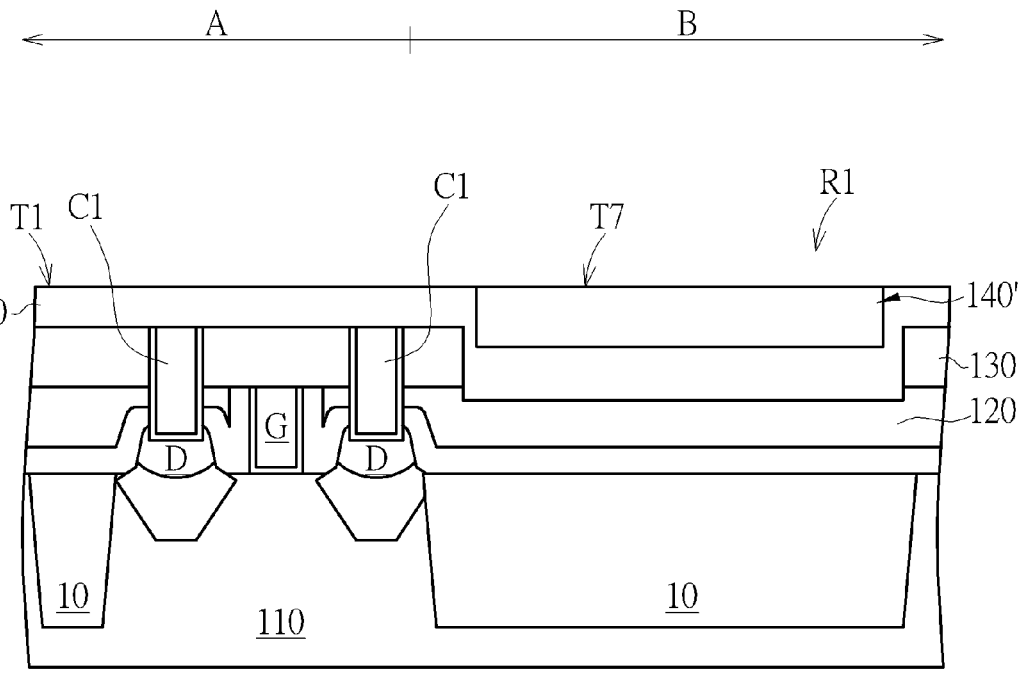
FIG. 5 schematically depicts a cross-sectional view of an embedded resistor process according to another embodiment of the present invention.

In another embodiment, as shown in FIG. 5, the resistive layer 140 and the cap film 150 in the first embodiment are replaced by a bulk resistive layer 140'. In other words, after the buffer layer 20 is formed, a resistive layer (not shown) is formed to entirely cover the cap layer 130 (or the buffer layer 20) and fill the trench R1, and then a planarization process such as a chemical mechanical polishing (CMP) process is performed to remove the resistive layer outside the trench R1 by using the buffer layer 20 (or the cap layer 130) as a stop layer, thereby forming the bulk resistive layer 140'. In this embodiment, the cap film 150 is not formed, and a top surface T7 of the bulk resistive layer 140' is leveled with the top surface T1 of the buffer layer 20.

Later processes after the step of FIG. 3 are presented in the following, but these later processes can also be applied after the step depicted in FIG. 5.

Figure 4:
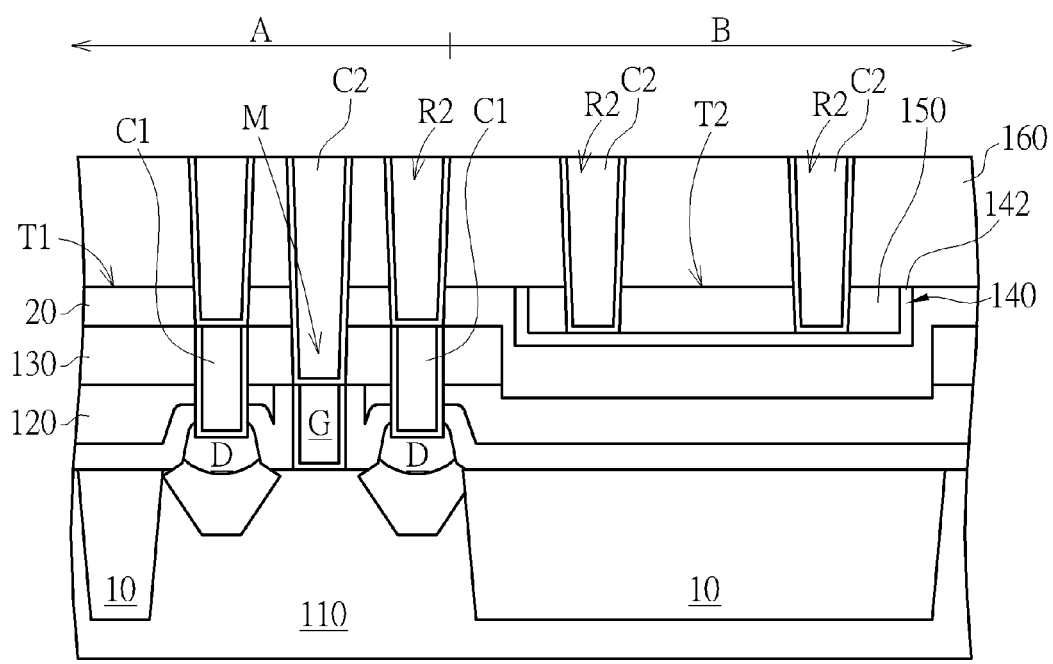

As shown in FIG. 4, a second interdielectric layer 160 is formed on the cap layer 130 (or the buffer layer 20), the resistive layer 140 and the cap film 150, and a plurality of contact plugs C2 is formed therein, wherein at least the two contact plugs in the second interdielectric layer 160 electrically connect the two ends of the resistive layer 140 respectively while the other part of the contact plugs located in the second interdielectric layer 160, the cap layer 130 and the buffer layer 20 electrically connect the gate G and the corresponding slot contacts C1. The second interdielectric layer 160 may be an oxide layer, and may be formed by a plurality of processes; the contact plugs C2 may be composed of metals such as tungsten or copper, but it is not limited thereto.

More precisely, the second interdielectric layer (not shown) is formed to cover the cap layer 130 (or the buffer layer 20), the resistive layer 140 and the cap film 150; the second interdielectric layer 160, the buffer layer 20 and the cap layer 130 are patterned to form a plurality of trenches R2 in the second interdielectric layer 160, the buffer layer 20 and the cap layer 130; metal (not shown) is filled into each of the trenches R2 and is planarized to form each of the contact plugs C2. At this time, the contact plugs C2 in the second area B are electrically connected to the resistive layer 140, while the contact plugs C2 in the first area A are electrically connected to the slot contacts C1 and the MOS transistor M.

Generally, the MOS transistor M is located in the first interdielectric layer 120 while the resistive layer 140 is located in material layers above the cap layer 130 and has a protruding ladder cross-sectional profile in the prior art. Therefore, the trenches R2 in the first area A and the second area B formed through a single process would have large depth differences, leading to insufficient etching in the first area A or over-etching in the second area B; contact plugs C2 formed by filling metals into the trenches through single process would have insufficient metal filling or metal overfilling; relative short contact plugs C2 may be entirely removed while the second interdielectric layer 160 is polished. In this embodiment, the resistive layer 140 embedded into the cap layer 130 can reduce the height difference between the contact plugs C2 in the first area A and the contact plugs C2 in the second area B, so that the aforesaid problems can be solved.

Moreover, the present invention provides an embedded resistor method, which forms the trench R1 in the cap layer 130 and then fills the resistive layer 140 in the cap layer 130, in a way to replace the aforesaid processes, which forms a resistive layer in a flat material layer directly and then patterns the resistive layer by etching to form a protruding ladder resistor. Therefore, the undercut of the resistive layer of nowadays processes caused by patterning the resistive layer can be avoided.

A second embodiment is further provided in the following, which not only has the advantages of the first embodiment but also can improve the photoresist forming problem of the first embodiment. FIGS. 6-9 schematically depict cross-sectional views of an embedded resistor process according to a second embodiment of the present invention.

Figure 6:
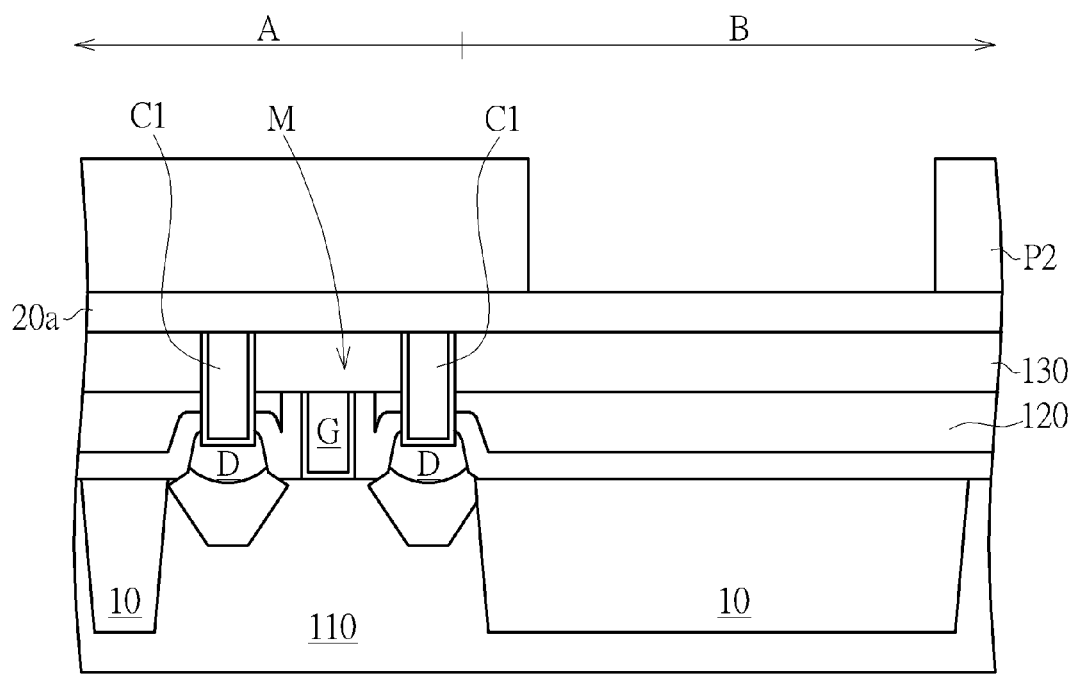
FIGS. 6-9 schematically depict cross-sectional views of an embedded resistor process according to a second embodiment of the present invention.

As shown in FIG. 6, a substrate 110 includes a first area A and a second area B, wherein the first area A is a transistor area while the second area B is a resistor area in this embodiment. A first interdielectric layer 120 is formed on the substrate 110 of the first area A and the second area B. The first interdielectric layer 120 may be an oxide layer, but it is not limited thereto. A MOS transistor M is disposed in the first interdielectric layer 120 of the first area A. A plurality of isolation structures 10 is located in the first area A and the second area B beside the MOS transistor M respectively. In this embodiment, the second area B will have a resistor formed above the first interdielectric layer 120, thereby having the isolation structure 10 being a bulk isolation structure in the substrate 10 of most part of the second area B, for preventing circuit leakages from penetrating the first interdielectric layer 120 into the substrate 110 when later formed resistors or contact plugs electrically connecting the resistors are formed, but it is not limited thereto. In another embodiment, the isolation structures 10 in the substrate 110 of the second area B may be composed of a plurality of isolation structures, or no isolation structure is formed in the substrate 110 of the second area B. Furthermore, the isolation structures 10 in the substrate 110 of the first area A are used for electrically isolating semiconductor components such as other transistors from the MOS transistor M.

A cap layer 130 is formed on the first interdielectric layer 120. The cap layer 130 may be a silicon nitride layer or a carbon-doped silicon nitride layer, but it is not limited thereto. A gate G of the MOS transistor M (with the gate G being a metal gate) can be isolated by the cap layer 130 and therefore being protected from being damaged in later processes or electrically connected to later formed metal wires above, which would lead to short circuits or circuit leakages. Thereafter, a lithography process is performed to pattern the cap layer 130 and the first interdielectric layer 120, and a plurality of trenches (not shown) is therefore formed therein and a source/drain region D of the MOS transistor M is exposed. Then, metal (not shown) is filled into the trenches and is planarized to form a plurality of slot contacts C1 or a plurality of columnar contact plugs (not shown) in the first interdielectric layer 120 and the cap layer 130, that are electrically connected to the MOS transistor M. Slot contacts C1 may be composed of metals such as tungsten or copper, but it is not limited thereto. The MOS transistor M may also include epitaxial structures K in the substrate 110 beside the gate G with parts of the epitaxial structures K may overlapping the source/drain region D, and metal silicide (not shown) between the source/drain region D and the slot contacts C1, wherein the metal silicide may be formed before/after the slot contacts C1 are formed.

A buffer layer 20a is formed on the flat cap layer 130. The buffer layer 20 may be an oxide layer, but it is not limited thereto. The buffer layer 20a can isolate the slot contacts C1 and prevent them from being damaged by later processes such as processes for forming metal layers thereon. Then, a patterned photoresist P2 is formed on the buffer layer 20a. Due to the patterned photoresist P2 being formed after the buffer layer 20a is formed, the patterned photoresist P2 can show good adhesivity when formed on the buffer layer 20a only. Moreover, the buffer layer 20a is generally an oxide layer while the cap layer 130 is a nitride layer, and the patterned photoresist P2 will not be removed completely when the reaction of the patterned photoresist P2 the nitride layer occurs. Thanks to the patterned photoresist P2 being formed on the buffer layer 20a, this problem can be solved in this embodiment.

Figure 7:
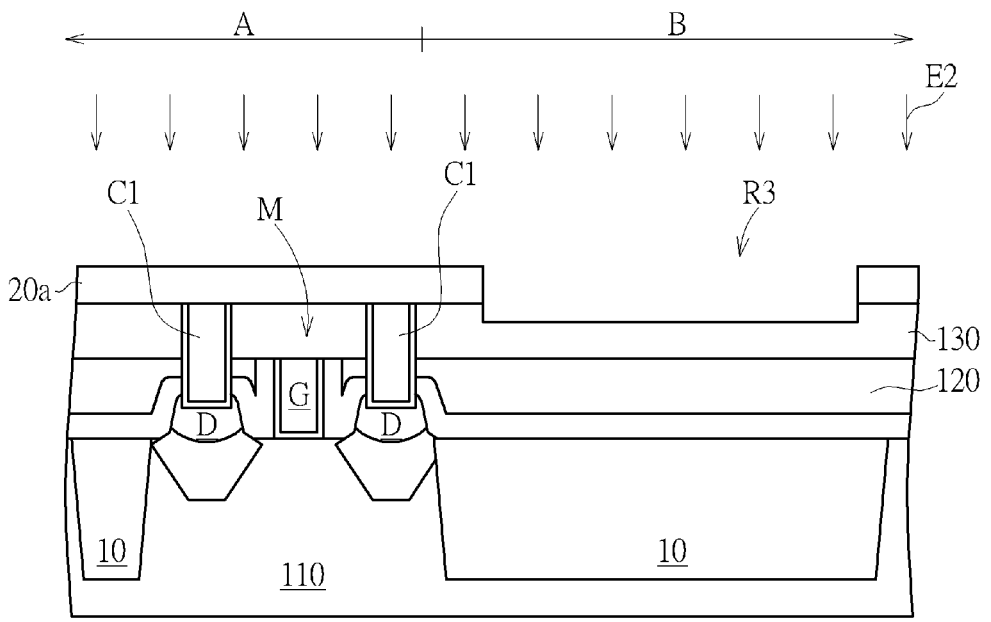
Figure 8:
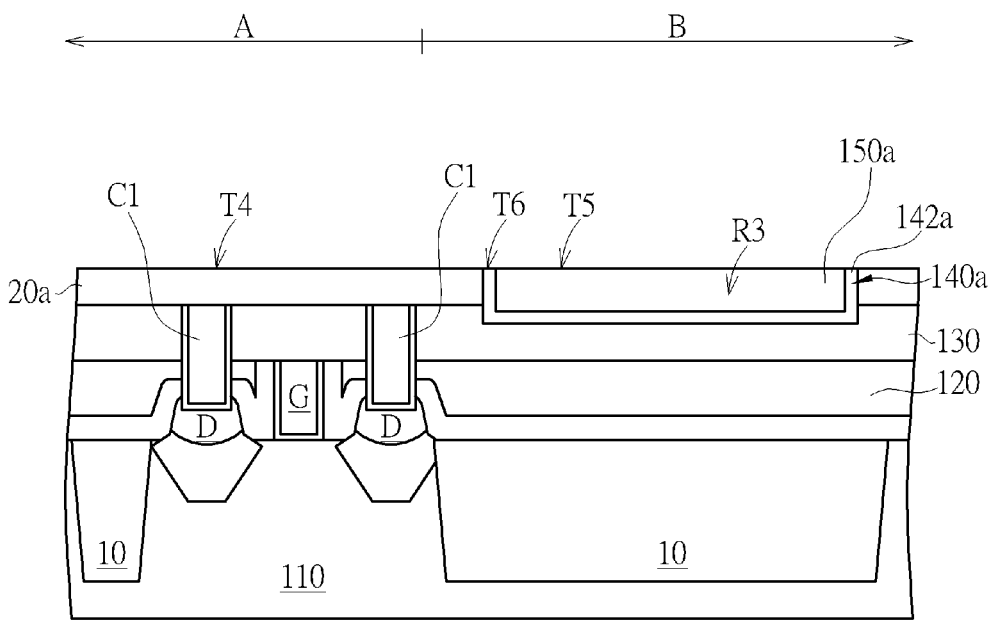

An etching process E2 is performed to etch the exposed part of the buffer layer 20a and parts of the cap layer 130, and a trench R3 is therefore formed in the buffer layer 20a and the cap layer 130, and then the patterned photoresist P2 is removed as shown in FIG. 7. In another embodiment, the etching step of the etching process E2 may be stop on the cap layer 130, and the trench R3 is therefore just formed in the buffer layer 20a only, but it is not limited thereto. As shown in FIG. 8, a resistive layer (not shown) and a cap film (not shown) are sequentially formed to entirely cover the buffer layer 20a and the cap layer 130 in the trench R3, and then a planarization process, such as a chemical mechanical polishing (CMP) process is performed to remove the resistive layer (not shown) and the cap film (not shown) right above the buffer layer 20a by using the buffer layer 20 as a stop layer, and a resistive layer 140a is therefore formed that conformally covers the surface of the trench R3, while a cap film 150a is formed in the trench R3 on the resistive layer 140a, thereby giving the resistive layer 140a a U-shaped cross-sectional profile. The resistive layer 140a may be a titanium nitride layer or a tantalum nitride layer and the cap film 150a may be a dielectric such as a silicon nitride layer, but it is not limited thereto. This way, the buffer layer 20a is disposed on the cap layer 130 but exposes the resistive layer 140a and the cap film 150a. Besides, a top surface T4 of the buffer layer 20a on the cap layer 130 is leveled with a top surface T5 of the cap film 150a; the U-shaped resistive layer 140a has at least a vertical part 142a parallel to the sidewall of the trench R3, and the top surface T5 of the cap film 150a is leveled with the top end T6 of the vertical part 142a.

Figures 9, 10:
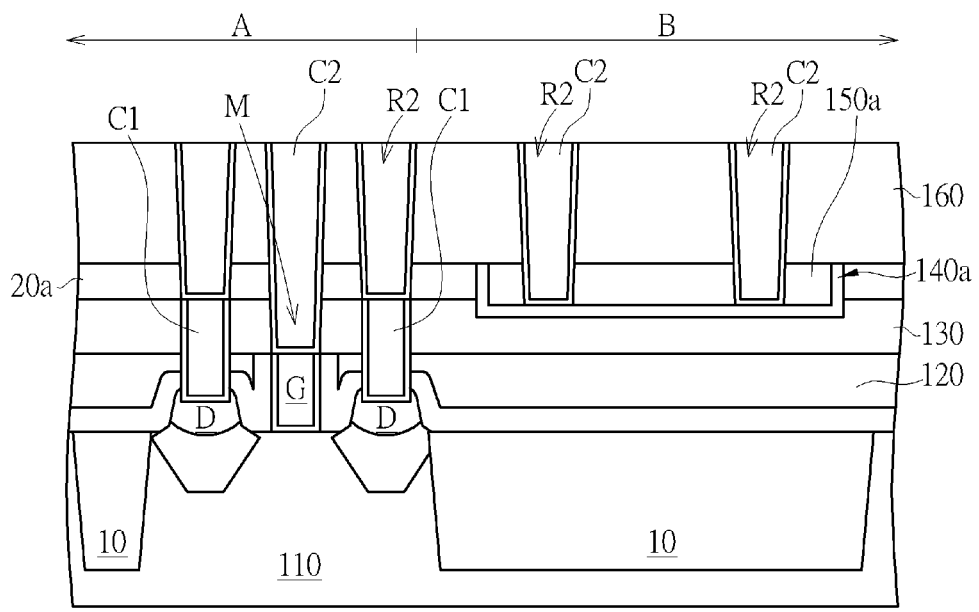
FIG. 10 schematically depicts a cross-sectional view of an embedded resistor process according to another embodiment of the present invention.

In another embodiment, as shown in FIG. 10, the resistive layer 140a and the cap film 150a in the second embodiment are replaced by a bulk resistive layer 140a'. In other words, after the buffer layer 20a is formed, a resistive layer (not shown) is formed to entirely cover the buffer layer 20a and fill the trench R3; then a planarization process, such as a chemical mechanical polishing (CMP) process is performed to remove the resistive layer outside the trench R3, thereby forming the bulk resistive layer 140a'. In this embodiment, the cap film 150a is not formed.

Later processes applied after the step illustrated in FIG. 8 (or FIG. 10) are presented. As shown in FIG. 9, a second interdielectric layer 160 is formed on the buffer layer 20a, the resistive layer 140a and the cap film 150a, and a plurality of contact plugs C2 is formed therein, wherein at least two of the contact plugs in the second interdielectric layer 160 are electrically connected to the two ends of the resistive layer 140a while the other parts of the contact plugs in the second interdielectric layer 160, the cap layer 130 and the buffer layer 20a are electrically connected to the gate G of the MOS transistor M and the corresponding slot contacts C1 respectively. The second interdielectric layer 160 may be an oxide layer, and may be formed by a plurality of processes; the contact plugs C2 may be composed of metals such as tungsten or copper, but it is not limited thereto.

More precisely, the second interdielectric layer (not shown) are formed to cover the buffer layer 20a, the resistive layer 140a and the cap film 150a entirely; the second interdielectric layer 160 is then planarized to form a plurality of trenches R2 in the second interdielectric layer 160; metal (not shown) is filled into each of the trenches R2 and is planarized to form the contact plugs C2. At this time, the contact plugs C2 in the second area B electrically are connected to the resistive layer 140, while the contact plugs C2 in the first area A electrically connect the slot contacts C1 and the MOS transistor M.

Therefore, the advantages of this embodiment are similar to advantages of the first embodiment, such as solving the problems of the trenches R3 in the first area A and the second area B formed through a single process having large depth differences, leading to insufficient etching in the first area A or over-etching in the second area B, of the contact plugs C2 formed by filling metals into the trenches through single process causing insufficient metal filling or over-filling; of the relative short contact plugs C2 being entirely removed when the second interdielectric layer 160 is polished. Besides, thanks to an embedded resistor method provided in this embodiment, the undercut of the resistive layer in the prior art caused by patterning the resistive layer can be avoided. Moreover, the embedded resistor formation method of this embodiment can further have the advantage of improving the photoresist adhesion and removal properties.

Moreover, at least a sacrificial gate may be selectively formed in the first interdielectric layer 120 right below the resistive layer 140 or 140a; in another way the bulk isolation structure 10 in the second area B can be replaced by a plurality of smaller isolation structures for preventing divots of the first interdielectric layer 120 or the isolation structures 10 from being generated.

Figure 11:
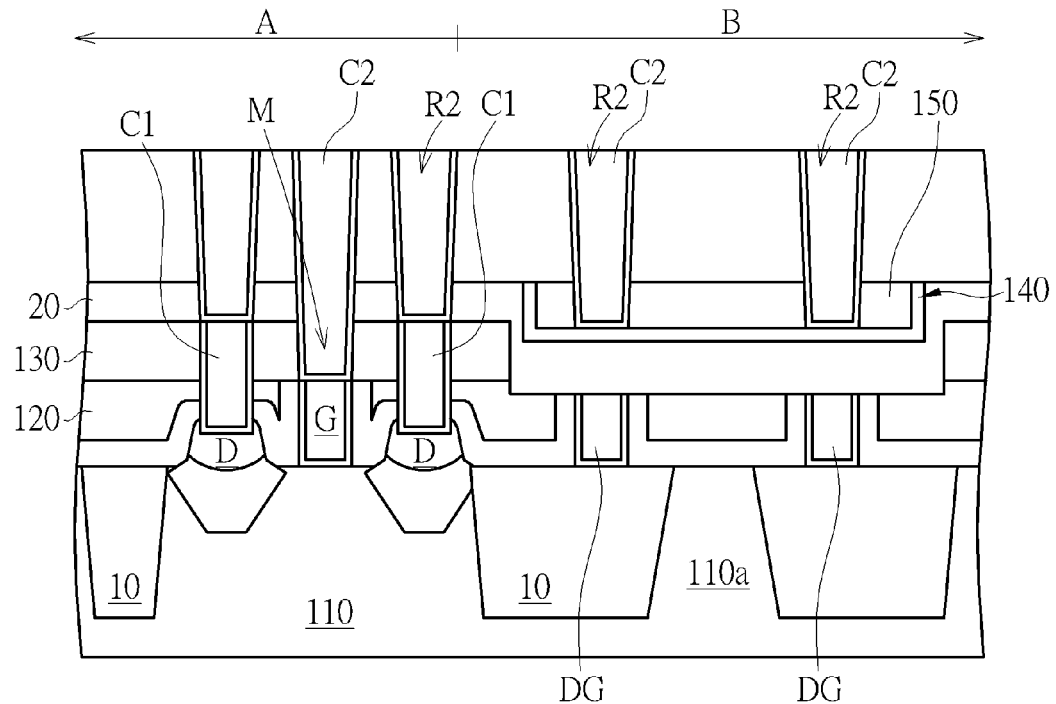
FIG. 11 schematically depicts a cross-sectional view of an embedded resistor having a sacrificial gate according to the first embodiment of the present invention.

As shown in FIG. 11, which schematically depicts a cross-sectional view of an embedded resistor having a sacrificial gate according to the first embodiment of the present invention, wherein sacrificial gates DG are located in the first interdielectric layer 120 right below the contact plugs C2 electrically connected to the resistive layer 140, and these sacrificial gates DG are all floating electrodes. Moreover, a plurality of smaller isolation structures may replace the bulk isolation structure 10 in the second area B, wherein each of the smaller isolation structures may correspond to the position of each of the sacrificial gates DG or the contact plugs C2 in the area B.

Figure 12:
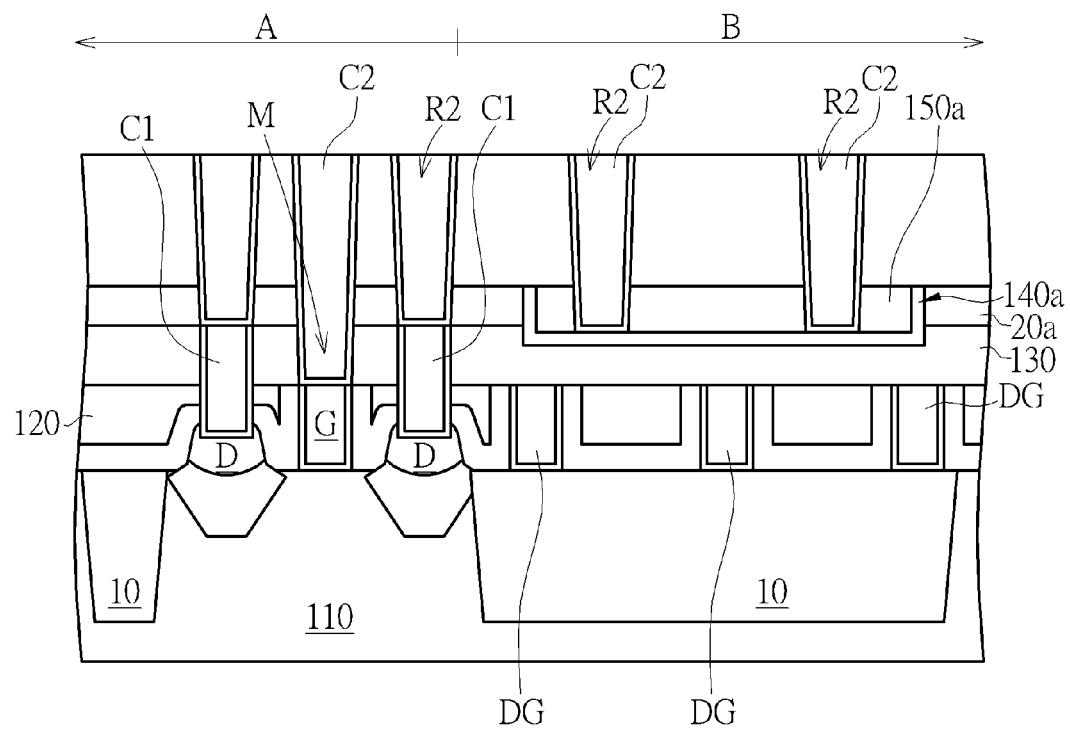
FIG. 12 schematically depicts a cross-sectional view of an embedded resistor having a sacrificial gate according to the second embodiment of the present invention.

In still another embodiment, as shown in FIG. 12, which schematically depicts a cross-sectional view of an embedded resistor having a sacrificial gate according to the second embodiment of the present invention, wherein sacrificial gates DG are located in the first interdielectric layer 120 right below the resistive layer 140a, but misaligning each of the contact plugs C2. By doing this, when the contact plugs C2 extend to the first interdielectric layer 120 in case of over-etching, the problem of parasitic capacitance effect can be improved.

FIGS. 11-12 show two embodiments using sacrificial gates DG. Not only the sacrificial gates DG are disposed right below or misaligning the contact plugs C2, but also a plurality of smaller isolation structures 10 between the substrate 110a can be formed in the first or second embodiment including the resistive layer 140, 140a having a U-shaped cross-sectional profile or a bulk resistive layer 140'/140a'.

To summarize, the present invention provides an embedded resistor, that forms trenches in materials such as a cap layer or a buffer layer then fills resistor material thereinto form an embedded resistor having a U-shaped cross-sectional profile or a bulk embedded resistor, thereby forming the embedded resistor. In this way, problems can be solved, including: trenches formed in different areas, such a transistor area and a resistor area, having large depth differences for forming contact plugs, causing insufficient etching or over-etching; metals for forming contact plugs in these trenches may over-fill or insufficiently fill the trenches due to large difference in heights of the contact plugs; contact plugs having lower heights may be entirely removed when an interdielectric is polished after the contact plugs are formed. Moreover, thanks to the present invention providing an embedded resistor, the resistive layer etched for being patterned in the prior art that caused undercut of the bottom surface of the resistive layer can be omitted.

Moreover, when the embedded resistor is formed in the buffer layer, i.e. the photoresist is directly formed on the buffer layer to form a trench, and then forms a resistive layer in the trench to form the embedded resistor, the photoresist can show good adhesivity due its formation on the buffer layer only. Besides, thanks to the buffer layer being an oxide layer, the photoresist won't be hard to remove because there will be no reaction with a nitride layer such as the cap layer.

Furthermore, the present invention can further include forming sacrificial gates in the first interdielectric layer, or replacing the bulk isolation structure by a plurality of smaller isolation structures instead, to prevent the generation of divots of the first interdielectric layer or the isolation structures. Even more, the sacrificial gates in the first interdielectric layer may misalign the contact plugs to reduce parasitic capacitance effect caused by the contact plugs extending to the first interdielectric layer due to over-etching from occurring.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An embedded resistor comprising:
   a first interdielectric layer located on a substrate;
   a cap layer located on and contacting the first interdielectric layer, wherein the cap layer has a trench;
   a resistive layer having a U-shaped cross-sectional profile covering the trench;
   a cap film located in the trench and on the resistive layer;
   a MOS transistor disposed in the first interdielectric layer beside the resistive layer;
   a buffer layer located above the MOS transistor, extending into and covering the trench and being located below the resistive layer; and
   a plurality of isolation structures located right below the resistive layer.

2. The embedded resistor according to claim 1, further comprising:
   a plurality of slot contacts disposed in the first interdielectric layer and electrically connected to the MOS transistor.

3. The embedded resistor according to claim 1, wherein the resistive layer comprises a titanium nitride layer.

4. The embedded resistor according to claim 1, wherein the cap film comprises a dielectric material.

5. The embedded resistor according to claim 1, further comprising:
   the buffer layer disposed on the cap layer but exposing the resistive layer and the cap film.

6. The embedded resistor according to claim 5, wherein a top surface of the cap film is leveled with a top surface of the buffer layer above the cap layer.

7. The embedded resistor according to claim 1, wherein the U-shaped resistive layer has at least a vertical part parallel to the sidewall of the trench and a top surface of the cap film is leveled with the top end of the vertical part.

8. The embedded resistor according to claim 1, further comprising:
a second interdielectric layer located on the cap layer, the resistive layer and the cap film; and
the buffer layer disposed on the cap layer but exposing the resistive layer and the cap film.

9. The embedded resistor according to claim 8, further comprising:
a plurality of contact plugs, wherein a part of the contact plugs is located in the second interdielectric layer and is electrically connected to the resistive layer while the other part of the contact plugs is located in the second interdielectric layer, the cap layer and the buffer layer and is electrically connected to the MOS transistor.

10. The embedded resistor according to claim 9, further comprising:
at least a sacrificial gate located in the first interdielectric layer right below the contact plugs electrically connected to the resistive layer.

11. The embedded resistor according to claim 9, further comprising:
at least a sacrificial gate located in the first interdielectric layer right below the resistive layer but misaligning the contact plugs.

12. An embedded resistor comprising:
a first interdielectric layer located on a substrate;
a cap layer located on the first interdielectric layer, wherein the cap layer has a trench and the cap layer and the first interdielectric layer having different materials;
a bulk resistive layer completely filling up the trench;
a MOS transistor disposed in the first interdielectric layer beside the bulk resistive layer;
a buffer layer located above the MOS transistor, extending into and covering the trench and being located below the bulk resistive layer;
a second interdielectric layer located on the cap layer and the bulk resistive layer; and
a plurality of contact plugs, wherein a part of the contact plugs is located in the second interdielectric layer and electrically connected to the bulk resistive layer respectively while the other part of the contact plugs is located in the second interdielectric layer, the cap layer and the buffer layer and is electrically connected to the MOS transistor respectively.

13. The embedded resistor according to claim 12, further comprising:
the buffer layer disposed on the cap layer but exposing the bulk resistive layer.

14. The embedded resistor according to claim 13, wherein a top surface of the bulk resistive layer is leveled with a top surface of the buffer layer above the cap layer.

15. The embedded resistor according to claim 12, further comprising:
the buffer layer disposed on the cap layer but exposing the bulk resistive layer.

16. The embedded resistor according to claim 12, further comprising:
at least a sacrificial gate located in the first interdielectric layer right below the contact plugs electrically connecting the bulk resistive layer.

17. The embedded resistor according to claim 12, further comprising:
at least a sacrificial gate located in the first interdielectric layer right below the bulk resistive layer but misaligning the contact plugs.

* * * * *